United States Patent  (10) Patent No.: US 10,256,781 B2
Ko et al.                  (45) Date of Patent:        Apr. 9, 2019

(54) COMPLEMENTARY METAL OXIDE SILICON TRANSCEIVER HAVING INTEGRATED POWER AMPLIFIER

(71) Applicant: FCI Inc., Seongnam-si, Gyeonggi-do (KR)

(72) Inventors: Dong Hyun Ko, Seongnam-si (KR); Min Chul Kang, Seongnam-si (KR); Myung Woon Hwang, Seongnam-si (KR)

(73) Assignee: FCI INC., Seongnam-si, Gyeonggi-Do (KR)

( * ) Notice: Subject to any disclaimer, the term of this patent is extended or adjusted under 35 U.S.C. 154(b) by 0 days.

(21) Appl. No.: 15/877,919

(22) Filed: Jan. 23, 2018

(65) Prior Publication Data

US 2018/0212574 A1    Jul. 26, 2018

(30) Foreign Application Priority Data

Jan. 23, 2017  (KR) .................. 10-2017-0010688

(51) Int. Cl.
*H03F 3/24*       (2006.01)
*H03F 1/02*       (2006.01)
*H04B 1/04*       (2006.01)

(52) U.S. Cl.
CPC .......... *H03F 3/245* (2013.01); *H03F 1/0244* (2013.01); *H04B 1/0475* (2013.01); *H03F 2200/09* (2013.01); *H03F 2203/21106* (2013.01); *H04B 1/04* (2013.01); *H04B 2001/0408* (2013.01)

(58) Field of Classification Search
CPC ..................................................... H03F 3/245
See application file for complete search history.

(56) References Cited

U.S. PATENT DOCUMENTS

| 7,860,454 B2 * | 12/2010 | Moloudi ............ H03H 11/1291 330/300 |
| 2009/0098831 A1 * | 4/2009 | Deng ................... H04B 1/0067 455/73 |
| 2011/0267144 A1 * | 11/2011 | Behera ..................... H03F 3/189 330/260 |
| 2012/0001666 A1 * | 1/2012 | Brown ....................... H03L 7/00 327/118 |
| 2012/0013387 A1 * | 1/2012 | Sankaranarayanan ...................... H03H 7/422 327/355 |
| 2014/0375367 A1 * | 12/2014 | Chen ....................... H03K 3/017 327/210 |

* cited by examiner

*Primary Examiner* — Patricia T Nguyen
(74) *Attorney, Agent, or Firm* — Muncy, Geissler, Olds & Lowe, P.C.

(57) ABSTRACT

A complementary metal oxide silicon transceiver having an integrated power amplifier is provided. The complementary metal oxide silicon transceiver having the integrated power amplifier is capable of controlling an output power according to a communication environment to solve the following problem that with the increment of an output level of a power amplifier, performance is decreased when noises flow into other blocks of a transceiver with power and thus are inputted to the power amplifier.

14 Claims, 3 Drawing Sheets

COMPLEMENTARY METAL OXIDE SILICON TRANSCEIVER HAVING INTEGRATED POWER AMPLIFIER

BACKGROUND

Field

The present disclosure relates to a complementary metal oxide silicon (CMOS) transceiver having an integrated power amplifier.

Background

The following content only provides background information related to embodiments of the present disclosure, and thus it does not constitute the prior art.

Recently, most blocks of wireless transceivers are manufactured as single chips using complementary metal oxide silicon (CMOS) manufacturing processes.

However, power amplifiers included in the blocks in the wireless transceivers are implemented (manufactured) using InGap/GaAs heterojunction bipolar transistor (HBT) manufacturing processes due to performance. The InGap/GaAs HBT manufacturing processes require higher cost than that of the CMOS manufacturing processes.

A transceiver and a power amplifier are implemented as a multi-chip because differences of the manufacturing processes. In order to match two chips including a transceiver and a power amplifier, additional components are required. Accordingly, more and more researches are toward the trend that the power amplifier is built in the transceiver after the power amplifier is manufactured by the CMOS manufacturing processes.

When a maximum output level of a power amplifier is used in a wireless communication system, a long distance communication can be implemented. Therefore, a transceiver is basically designed according to the maximum output level in which power efficiency can be achieved maximally. However, a lower output level can be implemented in a short distance communication environment according to a communication environment. In the above-mentioned process, the power amplifier can have good efficiency in the maximum output level, but the power efficiency cannot be improved in the lower output level. Accordingly, a low power mode is required.

A reason that it is difficult to dispose (manufacture) the power amplifier included in plural blocks in the wireless transceiver as a chip is described as follows. With the increment of the output level of the power amplifier, performance is decreased when noises flow into other blocks of the transceiver with power and thus are inputted to the power amplifier. Accordingly, a transceiver configured to eliminate the above-mentioned decreased performance is required.

SUMMARY OF THE DISCLOSURE

An objective of the present disclosure is to provide a complementary metal oxide silicon transceiver having an integrated power amplifier capable of controlling an output power according to a communication environment to solve the following problem that with the increment of an output level of a power amplifier, performance is decreased when noises flow into other blocks of a transceiver with power and thus are inputted to the power amplifier.

An implementation manner in accordance with an embodiment of the present disclosure provides a transmitter including a power supply part configured to output a direct current to direct current voltage or a battery voltage; a mixer configured to receive differential input signals from a local oscillator via in-phase input terminals and quadrature input terminals, and configured to output a frequency mixed signal after up mixing frequencies of the differential input signals; a driver amplifier connected to output terminals of the mixer, configured to receive the frequency mixed signal, configured to receive the direct current to direct current voltage or the battery voltage, configured to amplify the frequency mixed signal, and configured to output a drive signal, wherein the direct current to direct current voltage or the battery voltage serves as a power source of the driver amplifier; and a power amplifier comprising a first power amplifier and a second power amplifier which are connected to output terminals of the driver amplifier, configured to receive the direct current to direct current voltage or the battery voltage, configured to amplify the drive signal inputted to the first power amplifier and the second power amplifier, and configured to output a power signal in a balanced unbalanced (Balun) type, wherein the direct current to direct current voltage or the battery voltage serves a power source of the power amplifier.

As mentioned above, in the embodiment of the present disclosure, in order to increase a power supply rejection ratio (PSRR) of the driver amplifier serving an input of the power amplifier, a low dropout (LDO) regulator is disposed inside the driver amplifier. As such, the power amplifier included in plural blocks of a wireless transceiver is manufactured as a chip to solve the following problem that with the increment of the output level of the power amplifier, the performance is decreased when the noises flow into other blocks of the transceiver with the power and thus are inputted to the power amplifier.

In other words, when the low dropout regulator is used outside the chip, the noises of the power sources can be eliminated but the noises of the bonding wires resulted from inductance coupling in a chip package. In the embodiment of the present disclosure, the low dropout regulator is disposed inside the driver amplifier in the wireless transceiver, so as to achieve effect of eliminating the noises of the bonding wires resulted from inductance.

The embodiment of the present disclosure has the following effect. In order to control an output power to increase power efficiency in a low power level, the power amplifier has a low power mode. The driver amplifier configured to drive the power amplifier further has a gain mode. The driver amplifier can control the output power in 1 dB per step.

The embodiment of the present disclosure has the following effect. When a receiver is constituted, a receiver chip developed by a CMOS and a power amplifier chip can be manufactured as a single chip capable of adjusting an output power by using a CMOS manufacturing process. In the power amplifier, the power efficiency in the low power level can be increased in the low power mode.

DETAILED DESCRIPTION OF ILLUSTRATED EMBODIMENTS

Hereinafter, embodiments of the present disclosure will be described with reference to the accompanying drawings.

Figure 1:
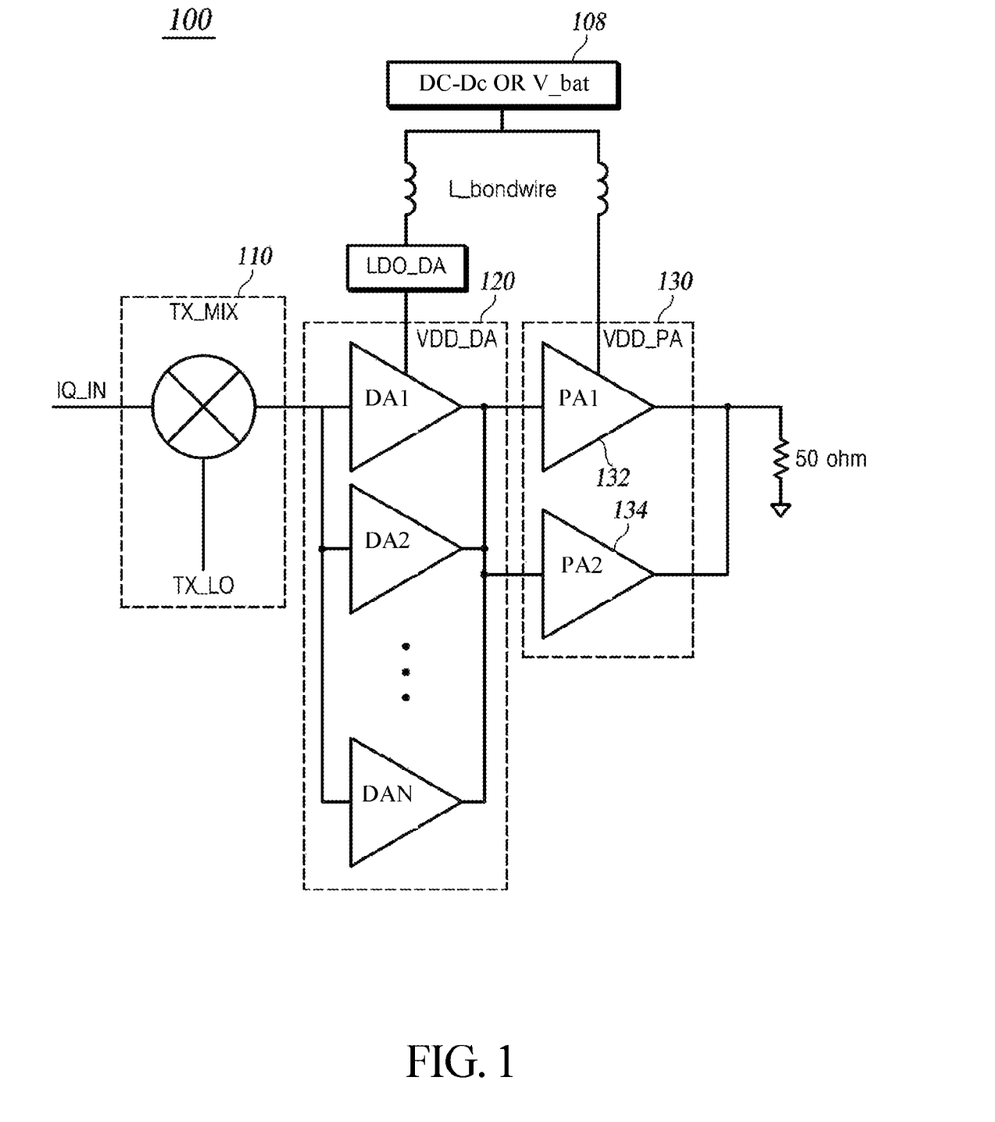
FIG. 1 illustrates a circuit structure diagram of a transmitter including a power amplifier in accordance with an embodiment of the present disclosure.
Figure 2:
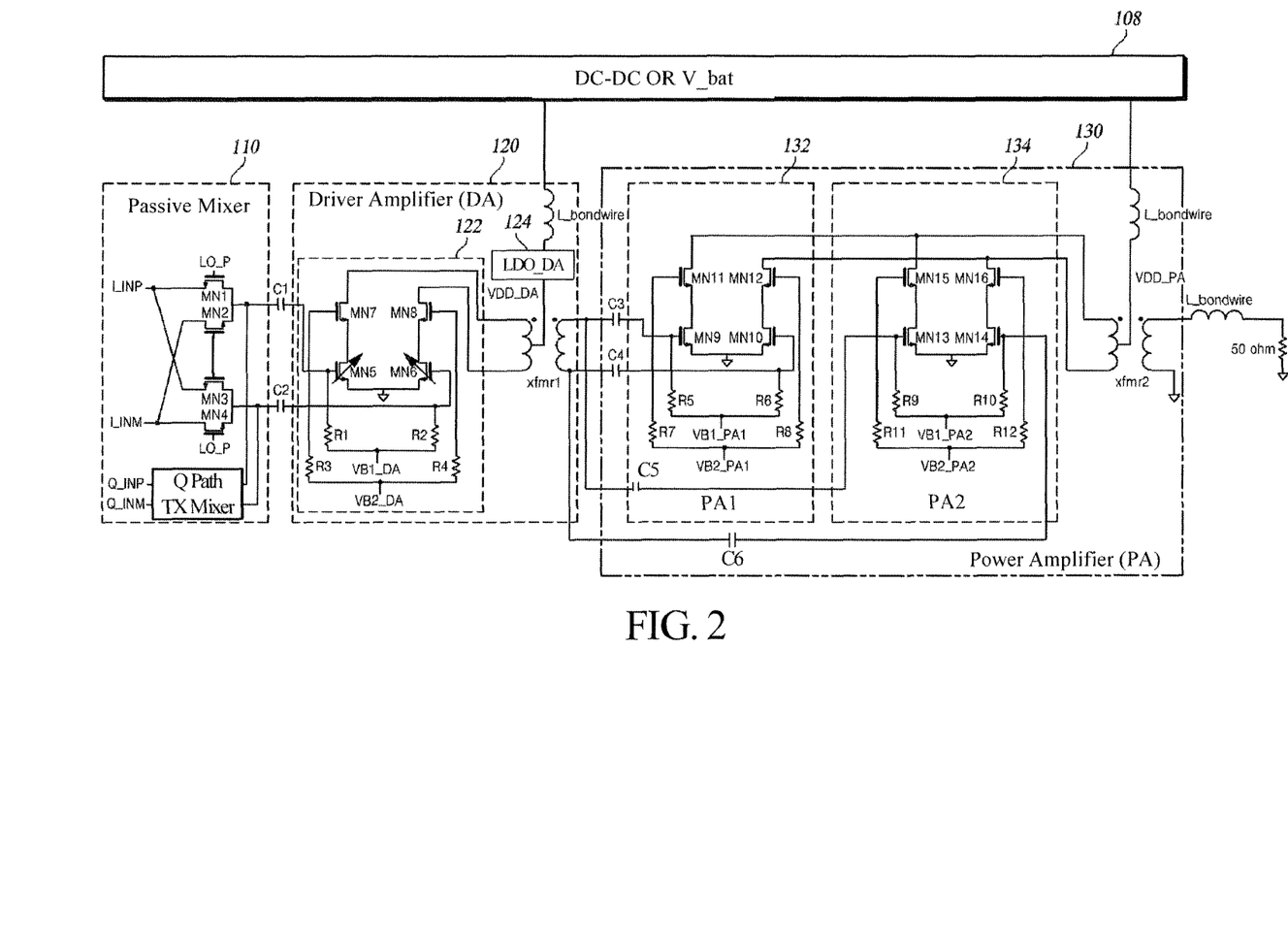
FIG. 2 illustrates a detailed circuit structure diagram of the transmitter in accordance with an embodiment of the present disclosure.

FIG. 1 illustrates a circuit structure diagram of a transmitter (TX) including a power amplifier (PA) in accordance with an embodiment of the present disclosure. FIG. 2 illustrates a detailed circuit structure diagram of the transmitter in accordance with an embodiment of the present disclosure.

The transmitter 100 in accordance with the embodiment of the present disclosure includes a power supply part 108, a mixer 110, a driver amplifier (DA) 120, and a power amplifier (PA) 130. Components included in the transmitter 100 are not limited thereto.

The embodiment of the present disclosure is described based on the transmitter 100 included in a wireless transceiver or in a receiver (RX).

When the power amplifier 130 included in plural blocks of the transmitter 100 included in the wireless transceiver is manufactured as a single chip, the following effect occurs. With the increment of an output level of the power amplifier 130, performance is decreased when noises of bonding wire inductance flow into other blocks of the transceiver with power and a chip package, and thus the noises are inputted to the power amplifier. In order to eliminate the effect of the decreased performance, the transmitter 100 of the present disclosure increases a power supply rejection ratio (PSRR) of the driver amplifier 120 inputted to the power amplifier 130. The transmitter 100 of the present disclosure can include a low dropout (LDO) regulator 124 disposed therein to increase the PSRR.

When the transmitter 100 controls an output power, the power amplifier 130 should have a low power mode to increase power efficiency in a low power level. The driver amplifier 120 configured to drive the power amplifier 130 further has a gain mode. The driver amplifier 120 can control the output power in 1 dB per step.

The power amplifier 130 using a CMOS manufacturing process can be built in the transmitter 100 and support communication standards of wireless local area network (WLAN), e.g., 802.11b, 802.11g, and 802.11n.

The transmitter 100 can support a maximum power of 21 dBm (Pmax=21 dBm) using the CMOS manufacturing process. When the transmitter 100 supports 802.11b, the transmitter 100 can support 21 dBm. When the transmitter 100 supports modulation and coding scheme 7 (MCS 7), the transmitter 100 can support 17 dBm.

In order to eliminate, by building the power amplifier 130 in the transmitter 100, the decreased performance of other blocks resulted from the power, the low dropout regulator 124 is disposed in the driver amplifier 120.

A driving amplifying part 122 is positioned below the low dropout regulator 124 bonding to the power amplifier 130.

The driver amplifier 120 connected to the mixer 110 has the gain mode. In the power amplifier 130, a power mode can be controlled by switching ON/OFF of two power amplifiers including a first power amplifier (PA1) 132 and a second power amplifier (PA2) 134 before a balanced unbalanced (Balun) transformer is implemented.

The power supply part 108 is connected to the driver amplifier 120 and the power amplifier 130. The power supply part 108 provides a direct current to direct current (DC-DC) voltage or a battery voltage V_bat.

The mixer 110 is a passive mixer. The passive mixer can minimize a power supply coupling. The mixer 110 receives differential input signals from a local oscillator (LO) via in-phase and quadrature input terminals IQ_IN, and outputs a frequency mixed signal after up mixing frequencies of the differential input signals.

The driver amplifier 120 is connected to output terminals of the mixer 110 and receives the frequency mixed signal. The driver amplifier 120 receives the DC-DC voltage or the battery voltage V_bat from the power supply part 108, amplifies the frequency mixed signal, and outputs a drive signal. The DC-DC voltage or the battery voltage V_bat serves a power source.

The output power of the driver amplifier 120 is set to be less than 1 dB per step, so that variations at inter stage matching with the power amplifier 130 can be minimized. Therefore, linearity performance of the power amplifier 130 does not change.

The driver amplifier 120 directly receives the DC-DC voltage or the battery voltage V_bat. The driver amplifier 120 uses the DC-DC voltage or the battery voltaic V_bat as a power source.

In order to avoid the power supply coupling resulted from the increment of the output power of the power amplifier 130, the driver amplifier 120 uses the power source with another connecting method inside a chip. That is, the low dropout regulator 124 configured to drive the driver amplifier 120 is disposed to be connected to the DC-DC voltage or the battery voltage V_bat.

When only pins are disposed outside the chip to use other voltages without disposing the low dropout regulator 124, the coupling of the noises to a bonding wire L_bondwire affects the driver amplifier 120 due to a drive voltage VDD_PA. Accordingly, as shown in FIG. 2, the bonding wire L_bondwire is configured to isolate the low dropout regulator 124 in the package. Then, the noises from the power source are eliminated by the low dropout regulator 124.

The power amplifier 130 includes the first power amplifier 132 and the second power amplifier 134 connected to the output terminals of the driver amplifier 120. The power amplifier 130 receives the DC-DC voltage or the battery voltage V_bat from the power supply part 108, amplifies the drive signal inputted to the first power amplifier 132 and the second power amplifier 134, and outputs a power signal in a Balun type. The DC-DC voltage or the battery voltage V_bat serves a power source.

In order to increase the power efficiency based on various output powers, the power amplifier 130 can include plural modes. The power amplifier 130 directly receives the DC-DC voltage or the battery voltage V_bat from the power supply part 108. The DC-DC voltage or the battery voltage V_bat inputted from the power supply part 108 serves a power source of the power amplifier 130.

As shown in FIG. 1, when the power amplifier 130 uses a maximum output power, the first power amplifier 132 and the second power amplifier 134 are operated in an ON state. The driver amplifier 120 is also in an ON state, thereby corresponding to the maximum output power.

As shown in FIG. 2, the power supply part 108 is connected to the driver amplifier 120 and the power amplifier 130 via the bonding wires L_bondwire. The power supply part 108 provides the DC-DC voltage or the battery voltage V_bat for the driver amplifier 120 and the power amplifier 130 via the bonding wires L_bondwire.

The mixer 110 receives the differential input signals from the local oscillator, and outputs the frequency mixed signal after up mixing the frequencies the differential input signals.

The mixer 110 includes an in-phase path (I path) and a quadrature path (Q path). The I path and the Q path are implemented by passive mixer switches including plural amplifying elements. Different from the driver amplifier 120 and the power amplifier 130, the mixer 110 is a passive mixer which does not require receiving the DC-DC voltage or the battery voltage V_bat from the power supply part 108.

The mixer 110 amplifies in-phase components of the differential input signals in the I path via in-phase input terminals (I input terminals) I_INP and I_INM, and amplifies quadrature components of the differential input signals in the Q path via quadrature input terminals (Q input terminals) Q_INP and Q_INM. Then, the frequency mixed signal is acquired by up mixing the frequencies of the two amplified signals.

The I path of the mixer 110 includes a first mixer core switch MN1, a second mixer core switch MN2, a third mixer core switch MN3, and a fourth mixer core switch MN4. A current drawing-out terminal of the first mixer core switch MN1 and a current drawing-out terminal of the third mixer core switch MN3 are connected to the I input terminal I_INP. A current drawing-in terminal of the second mixer core switch MN2 and a current drawing-in terminal of the fourth mixer core switch MN4 are connected to the I input terminal. A current drawing-in terminal of the first mixer core switch MN1 is connected to a current drawing-out terminal of the second mixer core switch MN2. A current drawing-in terminal of the third mixer core switch MN3 is connected to a current drawing-out terminal of the fourth mixer core switch MN4. An input terminal of the second mixer core switch MN2 is connected to an input terminal of the third mixer core switch MN3.

The first mixer core switch MN1 and the fourth mixer core switch MN4 receive a local oscillator plus phase signal LO_P of the local oscillator in a channel frequency for a frequency up-mixing. The local oscillator plus phase signal LO_P serves one of the differential signals. The second mixer core switch MN2 and the third mixer core switch MN3 receive a local oscillator minus phase signal LO_M of the local oscillator in the channel frequency for the frequency up-mixing. The local oscillator minus phase signal LO_M serves as the other of the differential signals. A duty cycle is 25%.

The Q path of the mixer 110 includes the same structure as that of the I path.

A first capacitor C1 and a second capacitor C2 are connected between the output terminals of the mixer 110 and the input terminals of the driver amplifier 120.

One terminal of the first capacitor C1 is connected to the current drawing-in terminal of the first mixer core switch MN1 and the current drawing-out terminal of the second mixer core switch MN2. The other terminal of the first capacitor C1 is connected to one terminal of the driver amplifier 120. One terminal of the second capacitor C2 is connected to the current drawing-in terminal of the third mixer core switch MN3 and the current drawing-out terminal of the fourth mixer core switch MN4. The other terminal of the second capacitor C2 is connected to the other terminal of the driver amplifier 120. The first capacitor C1 and the second capacitor C2 eliminate direct current components of the frequency mixed signal outputted by the mixer 110, and then the frequency mixed signal is applied to a fifth amplifier MN5 and a sixth amplifier MN6 to serve as a bias voltage.

The driver amplifier 120 is connected to the output terminals of the mixer 110 to receive the frequency mixed signal. The driver amplifier 120 receives the DC-DC voltage or the battery voltage V_bat, amplifies the frequency mixed signal, and outputs the drive signal. The DC-DC voltage or the battery voltage V_bat serves as a power source.

The driver amplifier 120 includes the driving amplifying part 122 including a plurality of switching elements, the low dropout regulator 124, and a first transformer xfmr1. Input terminals of the driving amplifying part 122 are connected to the output terminals of the mixer 110. Output terminals of the driving amplifying part 122 are connected to input terminals of the first transformer xfmr1.

The driving amplifying part 122 includes the fifth amplifier MN5, the sixth amplifier MN6, a seventh amplifier MN7, and an eighth amplifier MN8.

Voltages applied to a first drive control input terminal VB1_DA and a second drive control input terminal VB2_DA are referred to direct current bias voltages of the fifth amplifier MN5, the sixth amplifier MN6, the seventh amplifier MN7, and the eighth amplifier MN8. When 0V is applied to the first drive control input terminal VB1_DA and the second drive control input terminal VB2_DA, the fifth amplifier MN5, the sixth amplifier MN6, the seventh amplifier MN7, and the eighth amplifier MN8 can be turned off.

A current draw terminal of the fifth amplifier MN5 and a current drawing-out terminal of the sixth amplifier MN6 are connected with each other. A control input terminal of the fifth amplifier MN5 and a control input terminal of the sixth amplifier MN6 are connected to the first drive control input terminal VB1_DA. A first resistor R1 is connected between the control input terminal of the fifth amplifier MN5 and the first drive control input terminal VB1_DA. One terminal of the first resistor R1 is connected to the control input terminal of the fifth amplifier MN5. The other terminal of the first resistor R1 is connected to the first drive control input terminal VB1_DA. A second resistor R2 is connected between the control input terminal of the sixth amplifier MN6 and the first drive control input terminal VB1_DA. One terminal of the second resistor R2 is connected to the control input terminal of the sixth amplifier MN6. The other terminal of the second resistor R2 is connected to the first drive control input terminal VB1_DA.

A current drawing-in terminal of the fifth amplifier MN5 is connected to a current drawing-out terminal of the seventh amplifier MN7. A current drawing-in terminal of the sixth amplifier MN6 is connected to a current drawing-out terminal of the eighth amplifier MN8. A control input terminal of the seventh amplifier MN7 and a control input terminal of the eighth amplifier MN8 are connected to the second drive control input terminal VB2_DA. A third resistor R3 is connected between the control input terminal of the seventh amplifier MN7 and the second drive control input terminal VB2_DA. One terminal of the third resistor R3 is connected to the control input terminal of the seventh amplifier MN7. The other terminal of the third resistor R3 is connected to the second drive control input terminal VB2_DA. A fourth resistor R4 is connected between the control input terminal of the eighth amplifier MN8 and the second drive control input terminal VB2_DA. One terminal of the fourth resistor R4 is connected to the control input terminal of the eighth amplifier MN8. The other terminal of the fourth resistor R4 is connected to the second drive control input terminal VB2_DA.

A current drawing-in terminal of the seventh amplifier MN7 is connected to one of the input terminals of the first transformer xfmr1. A current drawing-in terminal of the eighth amplifier MN8 is connected to the other of the input terminals of the first transformer xfmr1. The fifth amplifier MN5 and the sixth amplifier MN6 are gain variable amplifiers. Each of the fifth amplifier MN5 and the sixth amplifier MN6 includes plural sets of amplifying circuits at a magnification of $2^N$. N is a positive integer greater than or equal to 0. Each set of the amplifying circuits includes two amplifiers, and the sets of the amplifying circuits are connected in parallel.

Figure 3:
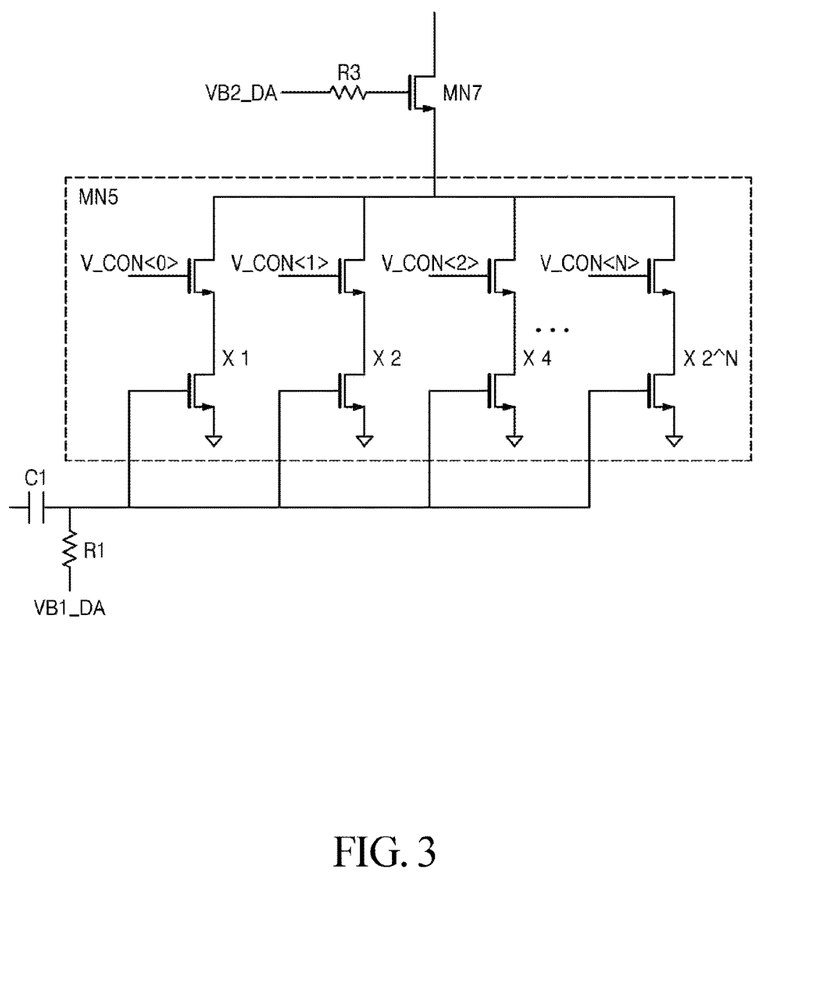
FIG. 3 illustrates a detailed circuit diagram of switching elements in the driver amplifier in accordance with an embodiment of the present disclosure.

The driver amplifier 120 in which the fifth amplifier MN5 and the sixth amplifier serve as inputs is not implemented by a single metal oxide semiconductor (MOS). As shown in FIG. 3, plural metal oxide semiconductors can be connected in parallel to control the size of the driver amplifier 120. The seventh amplifier MN7 and the eighth amplifier MN8 are implemented by metal oxide semiconductors having a single size. When the gain of the driver amplifier 120 is changed, an output impedance of the driver amplifier 120 can be minimized because the size of the seventh amplifier MN7 and the eighth amplifier MN8 is fixed. As such, a situation that the performance of the power amplifier 130 is affected because the gain of the amplifier 120 is changed can be avoided.

One terminal of the low dropout regulator 124 is connected to the power supply part 108. The other terminal of the low dropout regulator 124 is connected to a tap between the two input terminals of the first transformer xfmr1. The low dropout regulator 124 is connected to the power supply part 108 via the bonding wire L_bondwire. The DC-DC voltage or the battery voltage V_bat inputted via the bonding wire L_bondwire is stabilized by the low dropout regulator 124 and then inputted to the first transformer xfmr1.

Larger noises are generated in the power amplifier 130 because of the DC-DC voltage or the battery voltage V_bat applied by the power supply part 108. In the meantime, the larger noises are applied to the DC-DC voltage of the power supply part 108 or the battery voltage V_bat. In order to eliminate the larger noises generated in the power amplifier 130, the driving amplifying part 122 of the drier amplifier 120 is connected to the low dropout regulator 124.

In other words, the coupling of the larger noises via the bonding wire L_bondwire in the power amplifier 130 directly affects the DC-DC voltage of the power supply part 108 or the battery voltage V_bat. When the low dropout regulator 124 is used outside the chip, effect of decreasing the noises is less significant. Accordingly, the low dropout regulator 124 is disposed inside the chip.

The first transformer xfmr1 converts a voltage level of the drive signal and outputs a converted drive signal. The amplified output power (drive signal) in the driver amplifier 120 is transmitted to the power amplifier 130 via the first transformer xfmr1. The tap of the first transformer xfmr1 is connected to the low dropout regulator 124. The low dropout regulator 124 is connected to a power pin of the power supply part 108 via the bonding wire L_bondwire. The tap of the first transformer xfmr1 serves as an inductive load of the driver amplifier 120. The first transformer xfmr1 is used for inter-stage matching and impedance transformation.

The power amplifier 130 has a characteristic of increasing a saturation power (Psat), so that a cell is larger. Accordingly, input impedance should be designed to be smaller. The driver amplifier 120 should be designed to be capable of driving the input impedance. Therefore, the driver amplifier 120 includes the first transformer xfmr1. Two coils of the first transformer xfmr1 may be at a ratio of one of 1:1, 2:1, and 3:1.

When the two coils of the first transformer xfmr1 is at a ratio of 1:1, relative characteristics are described as follows. The input impedance of the power amplifier 130 is presented at a ratio of 1:1 in the output of the driver amplifier 120. Accordingly, a voltage swing is small, and VDD_DA is lowered. A high radio frequency (RF) again is difficult to be implemented because load impedance is small.

When the two coils of the first transformer xfmr1 is at a ratio of 3:1, relative characteristics are described as follows. The input impedance of the power amplifier 130 is presented at a ratio of 9:1 in the output of the driver amplifier 120. Accordingly, a voltage swing is large. When VDD_DA is high enough, a higher radio frequency (RF) gain can be acquired. Although a coupling coefficient at the ratio of 3:1 is smaller than that at the ratio of 1:1 and thus the gain at the ratio of 3:1 seems to be smaller than that at the ratio of 1:1, the gain at the ratio of 3:1 is larger than that at the ratio of 1:1 in a practical situation.

The characteristics of the ratios can be traded off according to a condition of VDD_DA and a required gain.

The power amplifier 130 is connected to the output terminals of the driver amplifier 120. The power amplifier 130 includes the first power amplifier 132 and the second power amplifier 134 which are connected to the output terminals of the driver amplifier 120. The power amplifier 130 receives the DC-DC voltage or the battery voltage V_bat from the power supply part 108, amplifies the drive signal inputted to the first power amplifier 132 and the second power amplifier 134, and outputs the power signal in a Balun type. The DC-DC voltage or the battery voltage V_bat serves a power source. The DC-DC voltage or the battery voltage V_bat serves a power source.

The power amplifier 130 includes the first power amplifier 132, the second power amplifier 134, and a second transformer xfmr2. The first power amplifier 132 and the second power amplifier 134 are connected to the power supply part 108 via the bonding wire L_bondwire. Output terminals of the first power amplifier 132 and the second power amplifier 134 are connected to input terminals of the second transformer xfmr2. The second transformer xfmr2 converts a voltage level of the power signal and outputs a converted power signal.

When the first power amplifier 132 and the second power amplifier 134 are operated in an ON state, the power amplifier 130 is operated in a high power mode. When the first power amplifier 132 is operated in the ON state but the second power amplifier 134 is operated in an OFF state, the power amplifier 130 is operated in a low power mode. Alternatively, when the first power amplifier 132 is operated in the OFF state but the second power amplifier 134 is operated in an ON state, the power amplifier 130 is operated in the low power mode.

The first power amplifier 132 includes a ninth amplifier MN9, a tenth amplifier MN10, an eleventh amplifier MN11, and a twelfth amplifier MN12. A current drawing-out terminal of the ninth amplifier MN9 and a current drawing-out terminal of the tenth amplifier MN10 are connected with each other. A control input terminal of the ninth amplifier MN9 and a control input terminal of the tenth amplifier MN10 are connected to a first power control input terminal VB1_PA1. A fifth resistor R5 is connected between the control input terminal of the ninth amplifier MN9 and the first power control input terminal VB1_PA1. One terminal of the fifth resistor R5 is connected to the control input terminal of the ninth amplifier MN9. The other terminal of the fifth resistor R5 is connected to the first power control input terminal VB1_PA1. A sixth resistor R6 is connected between the control input terminal of the tenth amplifier MN10 and the first power control input terminal VB1_PA1. One terminal of the sixth resistor R6 is connected to the control input terminal of the tenth amplifier MN10. The other terminal of the sixth resistor R6 is connected to the first power control input terminal VB1_PA1.

Voltages applied to the first power control input terminal VB1_PA1 and second power control input terminal VB2_PA1 are referred to direct current bias voltages of the ninth amplifier MN9, the tenth amplifier MN10, the eleventh amplifier MN11, and the twelfth Amplifier MN12. When 0V is applied to the first power control input terminal VB1_PA1 and the second power control input terminal VB2_PA1, the ninth amplifier MN9, the tenth amplifier MN10, the eleventh amplifier MN11, and the twelfth amplifier MN12 can be turned off.

A current drawing-in terminal of the ninth amplifier MN9 is connected to a current drawing-out terminal of the eleventh amplifier MN11. A current drawing-in terminal of the tenth amplifier MN10 is connected to a current drawing-out terminal of the twelfth amplifier MN12. A control input terminal of the eleventh amplifier MN11 and a control input terminal of the twelfth amplifier MN12 are connected to the second power control input terminal VB2_PA1. A seventh resistor R7 is connected between the control input terminal of the eleventh amplifier MN11 and the second power control input terminal VB2_PA1. One terminal of the seventh resistor R7 is connected to the control input terminal of the eleventh amplifier MN11. The other terminal of the seventh resistor R7 is connected to the second power control input terminal VB2_PA1. An eighth resistor R8 is connected between the control input terminal of the twelfth amplifier MN12 and the second power control input terminal VB2_PA1. One terminal of the eighth resistor R8 is connected to the control input terminal of the twelfth amplifier MN12. The other terminal of the eighth resistor R8 is connected to the second power control input terminal VB2_PA1.

A current drawing-in terminal of the eleventh amplifier MN11 is connected to one of input terminals of the second transformer xfmr2. A current drawing-in terminal of the twelfth amplifier MN12 is connected to the other of the input terminals of the second transformer xfmr2. The output terminals of the driver amplifier 120 are connected to the control input terminal of the ninth amplifier MN9 and the control input terminal of the tenth amplifier MN10.

A third capacitor C3 and a fourth capacitor C4 are connected between the output terminals of the driver amplifier 120 and input terminals of the first power amplifier 132. One terminal of the third capacitor C3 is connected to one of the output terminals of the first transformer xfmr1. The other terminal of the third capacitor C3 is connected to the control input terminal of the ninth amplifier MN9. One terminal of the fourth capacitor C4 is connected to the other of the output terminals of the first transformer xfmr1. The other terminal of the fourth capacitor C4 is connected to the control input terminal of the tenth amplifier MN10.

The third capacitor C3 and the fourth capacitor C4 can eliminate direct current components of the drive signal.

The second power amplifier 131 includes a thirteenth amplifier MN13, a fourteenth amplifier MN14, a fifth amplifier MN15, and a sixteenth amplifier MN16. A current drawing-out terminal of the thirteenth amplifier MN13 and a current drawing-out terminal of the fourteenth amplifier MN14 are connected with each other. A control input terminal of the thirteenth amplifier MN13 and a control input terminal of the fourteenth amplifier MN14 are connected to a first power control input terminal VB1_PA2. A ninth resistor R9 is connected between the control input terminal of the thirteenth amplifier MN13 and the first power control input terminal VB1_PA2. One terminal of the ninth resistor R9 is connected to the control input terminal of the thirteenth amplifier MN13. The other terminal of the ninth resistor R9 is connected to the first power control input terminal VB1_PA2. A tenth resistor R10 is connected between the control input terminal of the fourteenth amplifier MN14 and the first power control input terminal VB1_PA2. One terminal of the tenth resistor R10 is connected to the control input terminal of the fourteenth amplifier MN14. The other terminal of the tenth resistor R10 is connected to the first power control input terminal VB1_PA2.

Voltages applied to the first power control input terminal VB1_PA2 and a second power control input terminal VB2_PA2 are referred to direct current bias voltages of the thirteenth amplifier MN13, the fourteenth amplifier MN14, the fifth amplifier MN15, and the sixteenth amplifier MN16. When 0V is applied to the first power control input terminal VB1_PA2 and the second power control input terminal VB2_PA2, the thirteenth amplifier MN13, the fourteenth amplifier MN14, the fifth amplifier MN15, and the sixteenth amplifier MN16 can be turned off.

A current drawing-in terminal of the thirteenth amplifier MN13 is connected to a current drawing-out terminal of the fifth amplifier MN15. A current drawing-in terminal of the fourteenth amplifier MN14 is connected to a current drawing-out terminal of the sixteenth amplifier MN16. A control input terminal of the fifth amplifier MN15 and a control input terminal of the sixteenth amplifier MN16 are connected to the second power control input terminal VB2_PA2. An eleventh resistor R11 is connected between the control input terminal of the fifth amplifier MN15 and the second power control input terminal VB2_PA2. One terminal of the eleventh resistor R11 is connected to the control input terminal of the fifth amplifier MN15. The other terminal of the eleventh resistor R11 is connected to the second power control input terminal VB2_PA2. A twelfth resistor R12 is connected between the control input terminal of the sixteenth amplifier MN16 and the second power control input terminal VB2_PA1. One terminal of the twelfth resistor R12 is connected to the control input terminal of the sixteenth amplifier MN16. The other terminal of the twelfth resistor R12 is connected to the second power control input terminal VB2_PA2.

A current drawing-in terminal of the fifth amplifier MN15 is connected to one of the input terminals of the second transformer xfmr2. A current drawing-in terminal of the sixteenth amplifier MN16 is connected to the other of the input terminals of the second transformer xfmr2. The output terminals of the driver amplifier 120 are connected to the control input terminal of the thirteenth amplifier MN13 and the control input terminal of the fourteenth amplifier MN14.

A fifth capacitor C5 and a sixth capacitor C6 are connected between the output terminals of the driver amplifier 120 and input terminals of the second power amplifier 134. One terminal of the fifth capacitor C5 is connected to one of the output terminals of the first transformer xfmr1. The other terminal of the fifth capacitor C5 is connected to the control input terminal of the thirteenth amplifier MN13. One terminal of the sixth capacitor C6 is connected to the other of the output terminals of the first transformer xfmr1. The other terminal of the sixth capacitor C6 is connected to the control input terminal of the fourteenth amplifier MN14. The fifth capacitor C5 and the sixth capacitor C6 can eliminate the direct current components of the drive signal.

The output power passing through secondary inductance of the first transformer xfmr1 and transmitted via the third capacitor C3 to the sixth capacitor C6 is amplified by the first power amplifier 132 and the second power amplifier 134. The voltages of the first power control input terminal VB1_PA1 and the second power control input terminal VB2_PA1 can be controlled by the third capacitor C3 to the sixth capacitor C6, so that the power amplifier 130 is operated in the high power mode or the low power mode by controlling the first power amplifier 132 and the second power amplifier 134 to be turned on or turned off.

The output power (a power signal) is generated after the outputs of the first power amplifier 132 and the second power amplifier 134 pass the second transformer xfmr2 serving as a balanced unbalanced (Balun) transformer. For example, an amplifier constituted by the ninth amplifier MN9 to the twelfth amplifier MN12 is called the first power amplifier 132. An amplifier constituted by the thirteenth amplifier MN13 to the sixteenth amplifier MN16 is called the second power amplifier 134. In the high power mode, voltages enabling the first power amplifier 132 to be turned on are inputted to the first power control input terminal VB1_PA1 and the second power control input terminal VB2_PA1, and voltages enabling the second power amplifier 134 to be turned on are inputted to the first power control input terminal VB1_PA2 and the second power control input terminal VB2_PA2. In the high power mode, the maximum output level is used. In the high power mode in practice, the power gain is approximately 15 dB. A gain ratio of the first power amplifier 132 to the second power amplifier 134 is 1:1.

Turning off only one of the first power amplifier 132 and the second power amplifier 134 can enter the low power mode. For example, the second power amplifier 134 is turned off, and the first power amplifier 132 serves as a main amplifier in the low power mode. When the bias voltages enabling the first power amplifier 132 to be turned on are inputted to the first power control input terminal VB1_PA1 and the second power control input terminal VB2_PA1, the first power control input terminal VB1_PA2 and the second power control input terminal VB2_PA2 are grounded to turn off the second power amplifier 134, and the gain ratio is set as 1:1, the power gain is decreased by 6 dB.

In the low power mode, the state of the second power amplifier 134 which is turned off affects performance most. However, when the power amplifier constituted by the thirteenth amplifier MN13 to the sixteenth amplifier MN16 is operated in a small signal mode, the problem does not exist.

In the low power mode, the thirteenth amplifier MN13 to the sixteenth amplifier MN16 are turned off in the small signal mode. However, the outputs of the eleventh amplifier MN11 and the twelfth amplifier MN12 serve as the output of the power amplifier 130 and swing in a larger range of an output power level. Accordingly, turning off the states of the fifteenth amplifier MN15 and the sixteenth amplifier MN16 accurately is most important.

The second transformer xfmr2 serves as a Balun transformer. The second transformer xfmr2 may be used for impedance transformation. The second transformer xfmr2 may be connected to a receiver via a switching circuit. When the second transformer xfmr2 is connected to the receiver via the switching circuit, the transmitter 100 may be implemented as a transceiver.

FIG. 3 illustrates a detailed circuit diagram of switching elements in the driver amplifier in accordance with an embodiment of the present disclosure.

As shown in FIG. 2, the driver amplifier 120 in accordance with the embodiment of the present disclosure includes the driving amplifying part 122. The driving amplifying part 122 includes the fifth amplifier MN5, the sixth amplifier MN6, the seventh amplifier MN7, and the eighth amplifier MN8. The current drawing-out terminal of the fifth amplifier MN5 and the current drawing-out terminal of the sixth amplifier MN6 are connected with each other.

The control input terminal of the fifth amplifier MN5 and the control input terminal of the sixth amplifier MN6 are connected to the first drive control input terminal VB1_DA. The first resistor R1 is connected between the control input terminal of the fifth amplifier MN5 and the first drive control input terminal VB1_DA. One terminal of the first resistor R1 is connected to the control input terminal of the fifth amplifier MN5. The other terminal of the first resistor R1 is connected to the first drive control input terminal VB1_DA.

The second resistor R2 is connected between the control input terminal of the sixth amplifier MN6 and the first drive control input terminal VB1_DA. One terminal of the second resistor R2 is connected to the control input terminal of the sixth amplifier MN6. The other terminal of the second resistor R2 is connected to the first drive control input terminal VB1_DA.

The current drawing-in terminal of the fifth amplifier MN5 is connected to the current drawing-out terminal of the seventh amplifier MN7. The current drawing-in terminal of the sixth amplifier MN6 is connected to the current drawing-out terminal of the eighth amplifier MN8. The fifth amplifier MN5 and the sixth amplifier MN6 are gain variable amplifiers. Each of the fifth amplifier MN5 and the sixth amplifier MN6 includes plural sets of amplifying circuits at a magnification of $2^N$. N is a positive integer greater than or equal to 0. Each set of the amplifying circuits includes two amplifiers, and the sets of the amplifying circuits are connected in parallel.

FIG. 3 illustrates a detailed circuit of the fifth amplifier MN5 in FIG. 2. The circuit is used for controlling a power gain of the driver amplifier 120 based on transconductance (Gm). In main Gm cells, N source pins are added and grounded. Each of the main Gm cells can amplify 2 times. Each of the main Gm cells can be connected to a switch, so as to control the Gm to be ranged from V_CON<0> to V_CON<N>.

While the embodiments of the present disclosure have been shown and described, it will be understood the above-mentioned embodiments are merely exemplary to explain the present disclosure and not to be construed as limiting the present disclosure. Various changes, modifications, equivalents, and variants may be made by those skilled in the art from the scope of the present disclosure.

What is claimed is:

1. A transmitter, comprising:
   a power supply part configured to output a direct current to direct current voltage or a battery voltage;
   a mixer configured to receive differential input signals from a local oscillator via in-phase input terminals and quadrature input terminals, and configured to output a frequency mixed signal after up mixing frequencies of the differential input signals;
   a driver amplifier connected to output terminals of the mixer, configured to receive the frequency mixed signal, configured to receive the direct current to direct current voltage or the battery voltage, configured to amplify the frequency mixed signal, and configured to output a drive signal, wherein the direct current to direct current voltage or the battery voltage serves as a power source of the driver amplifier; and
   a power amplifier comprising a first power an amplifier and a second power amplifier which are connected to output terminals of the driver amplifier, configured to receive the direct current to direct current voltage of the battery voltage, configured to amplify the drive signal inputted to the first power amplifier and the second power amplifier, and configured to output a power signal in a balanced unbalanced (Balun) type, wherein the direct current to direct current voltage or the battery voltage serves a power source of the power amplifier.

2. The transmitter of claim 1, wherein the mixer comprises an in-phase path and it quadrature path, and the mixer amplifies in-phase components of the differential input signals in the in-phase path via in-phase input terminals, amplifies quadrature components of the differential input signals in the quadrature path via quadrature input terminals, up-mixes frequencies of signals of the amplified in-phase signal components and the amplified quadrature components, and outputs the frequency mixed signal.

3. The transmitter of claim 2, wherein the in-phase path comprises a first mixer core switch, a second mixer core switch, a third mixer core switch, and a fourth mixer core switch.
 a current drawing-out terminal of the first mixer core switch and a current drawing-out terminal of the third mixer core switch are connected to one of the in-phase input terminals, and a current drawing-in terminal of the second mixer core switch and a current drawing-in terminal of the fourth mixer core switch are connected to the other of the in-phase input terminals,
 a current drawing-in terminal of the first mixer core switch is connected to a current drawing-out terminal of the second mixer core switch, and a current drawing-in terminal of the third mixer core switch is connected to a current drawing-out terminal of the fourth mixer core switch,
 an input terminal of the second mixer core switch is connected to an input terminal of the third mixer core switch.

4. The transmitter of claim 3, wherein a first capacitor and a second capacitor are connected between the output terminals of the mixer and input terminals of the driver amplifier,
 one terminal of the first capacitor is connected to the current drawing-in terminal of the first mixer core switch and the current drawing-out terminal of the second mixer core switch, and the other terminal of the first capacitor is connected to one of the input terminals of the driver amplifier,
 one terminal of the second capacitor is connected to fire current drawing-in terminal of the third mixer core switch and the current drawing-out terminal of the fourth mixer core switch, and the other terminal of the second capacitor is connected to the other of the input terminals of the driver amplifier,
 the first capacitor and the second capacitor eliminate direct current components of the frequency mixed signal.

5. The transmitter of claim 1, wherein the driver amplifier comprises a driving amplifying part including a plurality of switching elements, a low dropout regulator, and a first transformer,
 input terminals of the driving amplifying part are connected to the output terminals of the mixer, and output terminals of the driving amplifying part are connected to the first transformer,
 one terminal of the low dropout regulator is connected to the power supply part, and the other terminal of the low dropout regulator is connected to a tap between two input terminals of the first transformer.

6. The transmitter of claim 5, wherein the driving amplifying part comprises a fifth amplifier, a sixth amplifier, a seventh amplifier, and an eighth amplifier,
 a current drawing-out terminal of the fifth amplifier and a current drawing-out terminal of the sixth amplifier are connected with each other, and a control input terminal of the fifth amplifier and a control input terminal of the sixth amplifier are connected to a first drive control input terminal,
 a current drawing-in terminal of the fifth amplifier is connected to a current drawing-out terminal of the seventh amplifier, and a current drawing-in terminal of the sixth amplifier is connected to a current drawing-out terminal of the eighth amplifier,
 a control input terminal of the seventh amplifier and a control input terminal of the eighth amplifier are connected to a second drive control input terminal, a current drawing-in terminal of the seventh amplifier is connected to one of the input terminals of the first transformer, and a current drawing-in terminal of the eighth amplifier is connected to the other of the input terminals of the first transformer.

7. The transmitter of claim 6, wherein the fifth amplifier and the sixth amplifier are gain variable amplifiers, each of the fifth amplifier and sixth amplifier comprises plural sets of amplifying circuits at a magnification of $2^N$, N is a positive integer greater than or equal to 0, each set of the amplifying circuits comprises two amplifiers, and the sets of the amplifying circuits are connected in parallel.

8. The transmitter of claim 5, wherein the low dropout regulator is connected to the power supply part via a bonding wire,
 the direct current to direct current voltage or the battery voltage inputted via the bonding wire is stabilized by the low dropout regulator and inputted to the first transformer,
 the first transformer converts a voltage level of the drive signal and outputs a converted drive signal.

9. The transmitter of claim 5, wherein a third capacitor and a fourth capacitor are connected between the output terminals of the driver amplifier and input terminals of the first power amplifier,
 one terminal of the third capacitor is connected to one of output terminals of the first transformer, and the other terminal of the third capacitor is connected to a control input terminal of a ninth amplifier,
 one terminal of the fourth capacitor is connected to the other of the output terminals of the first transformer, and the other terminal of the fourth capacitor is connected to a control input terminal of a tenth amplifier,
 the third capacitor and the fourth capacitor eliminate direct current components of the drive signal.

10. The transmitter of claim 5, wherein a fifth capacitor and a sixth capacitor are connected between the output terminals of the driver amplifier and input terminals of the second power amplifier,
 one terminal of the fifth capacitor is connected to one of output terminals of the first transformer, and the other terminal of the fifth capacitor is connected to a control input terminal of a thirteenth amplifier,
 one terminal of the sixth capacitor is connected to the other of the output terminals of the first transformer, and the other terminal of the sixth capacitor is connected to a control input terminal of a fourteenth amplifier,
 the fifth capacitor and the sixth capacitor eliminate direct current components of the drive signal.

11. The transmitter of claim 1, wherein the power amplifier comprises a second transformer,
    the first power amplifier and the second power amplifier are connected to the power supply part via a bonding wire,
    output terminals of the first power amplifier and the second power amplifier are connected to input terminals of the second transformer,
    the second transformer converts a voltage level of the power signal and outputs a converted power signal.

12. The transmitter of claim 11, wherein the first power amplifier comprises a ninth amplifier, a tenth amplifier, an eleventh amplifier, and a twelfth amplifier,
    a current drawing-out terminal of the ninth amplifier and a current drawing-out terminal of the tenth amplifier are connected with each other, a control input terminal of the ninth amplifier and a control input terminal of the tenth amplifier are connected to a first power control input terminal,
    a current drawing-in terminal of the ninth amplifier is connected to a current drawing-out terminal of the eleventh amplifier, and a current drawing-in terminal of the tenth amplifier is connected to a current drawing-out terminal of the twelfth amplifier,
    a control input terminal of the eleventh amplifier and a control input terminal of the twelfth amplifier are connected to a second power control input terminal, a current drawing-in terminal of the eleventh amplifier is connected to one of the input terminals of the second transformer, and a current drawing-in terminal of the twelfth amplifier is connected to the other of the input terminals of the second transformer,
    the output terminals of the driver amplifier are connected to the control input terminal of the ninth amplifier and the control input terminal of the tenth amplifier.

13. The transmitter of claim 11, wherein the second power amplifier comprises a thirteenth amplifier, a fourteenth amplifier, a fifth amplifier, and a sixteenth amplifier,
    a current drawing-out terminal of the thirteenth amplifier and a current drawing-out terminal of the fourteenth amplifier are connected with each other, and a control input terminal of the thirteenth amplifier and a control input terminal of the fourteenth amplifier are connected to a first power control input terminal,
    a current drawing-in terminal of the thirteenth amplifier is connected to a current drawing-out terminal of the fifth amplifier, a current drawing-in terminal of the fourteenth amplifier is connected to a current drawing-out terminal of the sixteenth amplifier,
    a control input terminal of the fifth amplifier and a control input terminal of the sixteenth amplifier are connected to a second power control input terminal, a current drawing-in terminal of the fifth amplifier is connected to one of the input terminals of the second transformer, and a current drawing-in terminal of the sixteenth amplifier is connected to the other of the input terminals of the second transformer,
    the output terminals of the driver amplifier are connected to the control input terminal of the thirteenth amplifier and the control input terminal of the fourteenth amplifier.

14. The transmitter of claim 1, wherein when the first power amplifier and the second power amplifier are operated in an ON state, the power amplifier is operated in a high power mode,
    when one of the first power amplifier and the second power amplifier is operated in the ON state but the other of the first power amplifier and the second power amplifier is operated in an OFF state, the power amplifier is operated in a low power mode.

* * * * *